(12) United States Patent
Kawasaki et al.

(10) Patent No.: US 11,831,300 B2
(45) Date of Patent: Nov. 28, 2023

(54) ELASTIC WAVE FILTER APPARATUS

(71) Applicant: Murata Manufacturing Co., Ltd., Nagaokakyo (JP)

(72) Inventors: Koichiro Kawasaki, Nagaokakyo (JP); Taku Kikuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 554 days.

(21) Appl. No.: 16/815,097

(22) Filed: Mar. 11, 2020

(65) Prior Publication Data

US 2020/0212886 A1   Jul. 2, 2020

Related U.S. Application Data

(63) Continuation of application No. 15/712,204, filed on Sep. 22, 2017, now Pat. No. 10,601,399, which is a (Continued)

(30) Foreign Application Priority Data

Jun. 24, 2015   (JP) .................. 2015-126802

(51) Int. Cl.
*H03H 9/64* (2006.01)
*H03H 9/02* (2006.01)
(Continued)

(52) U.S. Cl.
CPC .............. *H03H 9/64* (2013.01); *H01L 23/12* (2013.01); *H03H 9/02834* (2013.01);
(Continued)

(58) Field of Classification Search
CPC .............. H03H 9/02; H03H 9/25; H03H 9/64
See application file for complete search history.

(56) References Cited

U.S. PATENT DOCUMENTS 6,078,229 A * 6/2000 Funada .................. H03H 9/059
29/25.35
6,310,422 B1 * 10/2001 Satoh .................. H03H 9/6483
310/313 R
(Continued)

FOREIGN PATENT DOCUMENTS

WO    WO-2014034326 A1 *   3/2014  ......... H03H 9/02834

OTHER PUBLICATIONS

Kawasaki et al., "Elastic Wave Filter Apparatus", U.S. Appl. No. 15/712,204, filed Sep. 22, 2017.

*Primary Examiner* — Andrea Lindgren Baltzell
*Assistant Examiner* — Alan Wong
(74) *Attorney, Agent, or Firm* — KEATING & BENNETT, LLP

(57) ABSTRACT

An elastic wave filter apparatus includes at least one excitation electrode, a first electrode land, and second electrode lands provided on a first main surface of a device substrate including a piezoelectric layer. A signal terminal and metal members are provided on a second main surface of the device substrate. The first electrode land and the signal terminal are connected to a signal potential, and the second electrode lands and the metal members are connected to a ground potential. A first connection electrode connects the first electrode land and the signal terminal, and a second connection electrode connects at least one of the second electrode lands and at least one of the metal members. The at least one metal member connected to the second connection electrode overlaps at least a portion of the at least one excitation electrode across the device substrate.

17 Claims, 10 Drawing Sheets

Related U.S. Application Data continuation of application No. PCT/JP2016/063990, filed on May 11, 2016.

(51) Int. Cl.
*H03H 9/25* (2006.01)
*H03H 9/10* (2006.01)
*H01L 23/12* (2006.01)

(52) U.S. Cl.
CPC .... *H03H 9/02944* (2013.01); *H03H 9/02992* (2013.01); *H03H 9/1092* (2013.01); *H03H 9/25* (2013.01); *H01L 2224/14* (2013.01); *H01L 2224/16227* (2013.01); *H01L 2924/16235* (2013.01)

(56) References Cited

U.S. PATENT DOCUMENTS

| | | | | |
|---|---|---|---|---|
| 6,566,981 | B2 * | 5/2003 | Urabe | H03H 9/1071 |
| | | | | 333/195 |
| 7,298,231 | B2 * | 11/2007 | Ikuta | H03H 9/725 |
| | | | | 333/133 |
| 8,004,370 | B2 * | 8/2011 | Yamagata | H03H 9/725 |
| | | | | 333/195 |
| 8,564,173 | B2 * | 10/2013 | Miyake | H03H 9/02866 |
| | | | | 310/313 R |
| 9,887,686 | B2 * | 2/2018 | Kuwahara | H03H 9/059 |
| 10,862,450 | B2 * | 12/2020 | Fujiya | H04B 1/38 |
| 2011/0006381 | A1 * | 1/2011 | Feiertag | B81B 7/007 |
| | | | | 438/51 |
| 2015/0109071 | A1 * | 4/2015 | Kikuchi | H03H 9/02834 |
| | | | | 333/186 |

\* cited by examiner

ELASTIC WAVE FILTER APPARATUS

CROSS REFERENCE TO RELATED APPLICATIONS

This application claims the benefit of priority to Japanese Patent Application No. 2015-126802 filed on Jun. 24, 2015 and is a Continuation Application of PCT Application No. PCT/JP2016/063990 filed on May 11, 2016. The entire contents of each application are hereby incorporated herein by reference.

BACKGROUND OF THE INVENTION

1. Field of the Invention

The present invention relates to an elastic wave filter apparatus including an elastic wave filter device and a mounting substrate on which an elastic wave filter device is mounted.

2. Description of the Related Art

In an elastic wave filter apparatus described in Japanese Unexamined Patent Application Publication No. 2009-159195, an IDT electrode and a wiring electrode connected to the IDT electrode are provided on a piezoelectric substrate. A frame member made of a metal frame is provided around a portion where the IDT electrode and the wiring electrode are provided. A covering member is provided so as to cover the opening of the frame member. Accordingly, a hollow space in which the IDT electrode and the wiring electrode are located is formed. A plurality of through electrodes are provided in the piezoelectric substrate. A first end of each through electrode is electrically connected to the wiring electrode. A second end of each through electrode is electrically connected to a terminal electrode provided on a bottom surface of the piezoelectric substrate.

When in use, the above-described elastic wave filter apparatus is mounted on the mounting substrate from the terminal electrode side. Heat is generated at the IDT electrode in the elastic wave filter apparatus when the IDT electrode is driven. This heat goes through the above-mentioned wiring electrode and through electrodes and reaches the terminal electrode. Thus, some of the heat is dissipated by the terminal electrode. However, heat dissipation is not sufficient.

SUMMARY OF THE INVENTION

Preferred embodiments of the present invention provide elastic wave filter apparatuses with excellent heat dissipation.

An elastic wave filter apparatus according to a preferred embodiment of the present invention includes a device substrate including a piezoelectric layer, the device substrate including a first main surface and a second main surface that face each other; at least one excitation electrode provided on the first main surface of the device substrate, the at least one excitation electrode defining an elastic wave filter device; a first electrode land and a plurality of second electrode lands provided on the first main surface of the device substrate and connected to the at least one excitation electrode, the first electrode land being connected to a signal potential, the plurality of second electrode lands being connected to a ground potential; a signal terminal and a plurality of metal members provided on the second main surface of the device substrate, the signal terminal being connected to the signal potential, the plurality of metal members being connected to the ground potential; a first connection electrode that connects the first electrode land and the signal terminal; and a second connection electrode that connects at least one of the plurality of second electrode lands and at least one of the plurality of metal members. The at least one of the plurality of metal members connected to the second connection electrode overlaps at least a portion of the at least one excitation electrode across the device substrate.

Another preferred embodiment of an elastic wave filter apparatus according to the present invention includes a supporting layer provided on the first main surface of the device substrate, a cover provided on the supporting layer, and the supporting layer, the cover, and the first main surface of the piezoelectric substrate define a hollow portion in which the excitation electrode is located.

In a preferred embodiment of an elastic wave filter apparatus according to the present invention, at least one of the plurality of metal members is preferably a ground terminal.

In another preferred embodiment of an elastic wave filter apparatus according to the present invention, an area of at least one of the plurality of metal members is preferably greater than an area of the signal terminal.

In another preferred embodiment of an elastic wave filter apparatus according to the present invention, the first and second connection electrodes preferably penetrate through the device substrate. In this case, the elastic wave filter apparatus is able to be made smaller.

In another preferred embodiment of an elastic wave filter apparatus according to the present invention, the device substrate preferably includes a lateral surface connecting the first main surface and the second main surface, and the first and second connection electrodes are provided on the lateral surface.

In another preferred embodiment of an elastic wave filter apparatus according to the present invention, the first and second connection electrodes and the at least one of the plurality of metal members preferably include a plating film. In this case, the first and second connection electrodes and the at least one of the plurality of metal members are able to be easily formed by plating.

In another preferred embodiment of an elastic wave filter apparatus according to the present invention, the signal terminal preferably includes a plurality of signal terminals provided on the second main surface of the device substrate, at least one of the plurality of signal terminals is located on one of two sides of the at least one of the plurality of metal members connected to the second connection electrode, and at least another one of the plurality of signal terminals is located on the other side of the at least one of the plurality of metal members connected to the second connection electrode In this case, isolation between signal terminals is increased. Therefore, the attenuation characteristics are less likely to deteriorate.

In another preferred embodiment of an elastic wave filter apparatus according to the present invention, the plurality of signal terminals preferably have a rectangular or substantially rectangular planar shape.

In another preferred embodiment of an elastic wave filter apparatus according to the present invention, the plurality of signal terminals preferably have a semicircular or substantially semicircular planar shape.

In another preferred embodiment of an elastic wave filter apparatus according to the present invention, each of the plurality of signal terminals preferably extends along one of opposed edges of the device substrate.

In another preferred embodiment of an elastic wave filter apparatus according to the present invention, the device substrate is preferably a piezoelectric substrate including the piezoelectric layer.

In another preferred embodiment of an elastic wave filter apparatus according to the present invention, the device substrate preferably includes a supporting substrate and the piezoelectric layer provided on the supporting substrate.

In another preferred embodiment of an elastic wave filter apparatus according to the present invention, at least one of the plurality of metal members is preferably located on one of two sides of the at least one of the plurality of metal members connected to the second connection electrode, and at least another one of the plurality of metal members is preferably located on the other side of the at least one of the plurality of metal members connected to the second connection electrode.

In another preferred embodiment of an elastic wave filter apparatus according to the present invention, the plurality of metal members preferably have a rectangular or substantially rectangular planar shape.

In another preferred embodiment of an elastic wave filter apparatus according to the present invention, the plurality of metal members preferably have a semicircular or substantially semicircular planar shape.

In another preferred embodiment of an elastic wave filter apparatus according to the present invention, each of the plurality of metal members preferably extends along one of opposed edges of the device substrate.

According to various preferred embodiments of the present invention, elastic wave filter apparatuses with excellent heat dissipation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Note that the preferred embodiments described in the specification are illustrative, and it is to be noted that a partial replacement or combination of elements or features is possible between different preferred embodiments.

Figure 1:
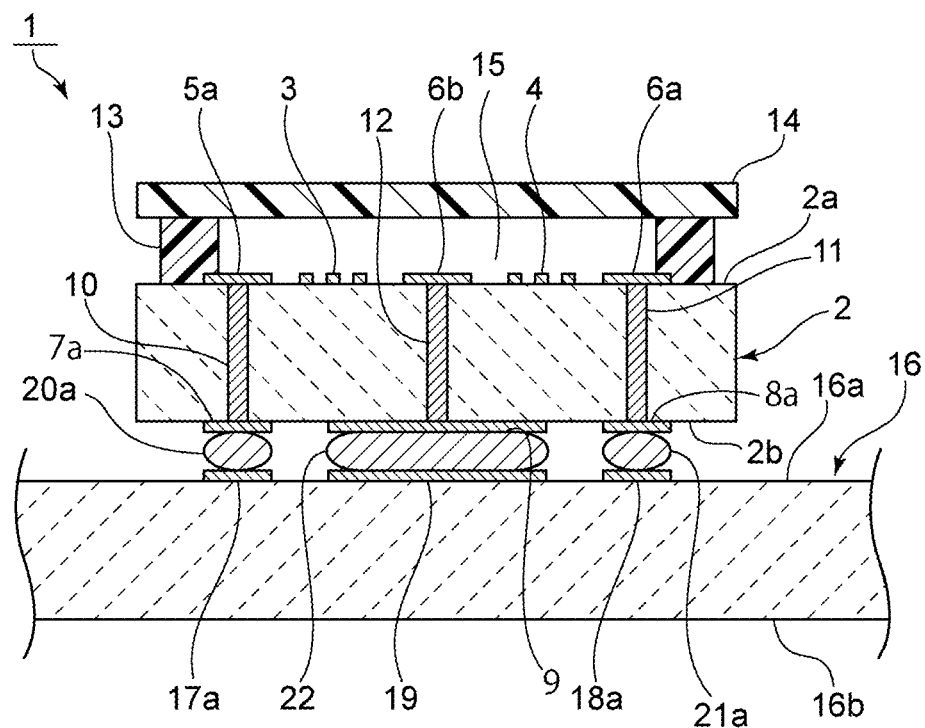
FIG. 1 is a partially-notched front cross-sectional view illustrating a portion where an elastic wave filter apparatus according to a first preferred embodiment of the present invention is mounted on a mounting substrate.
Figure 2:
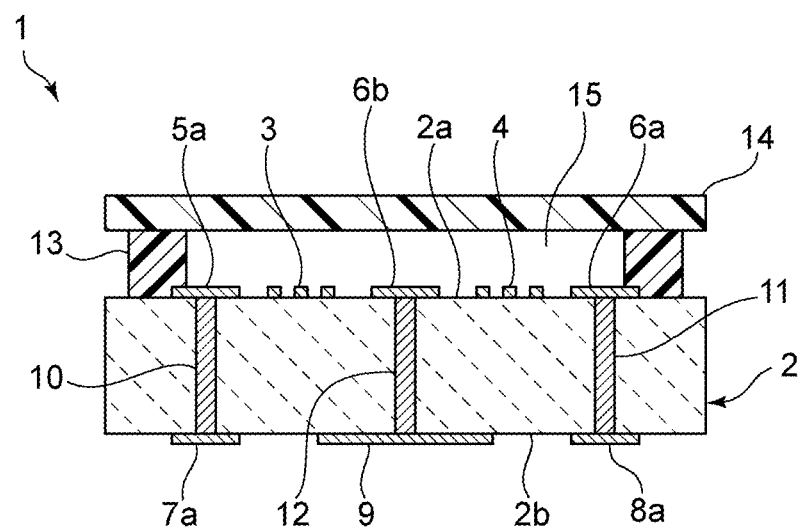
FIG. 2 is a front cross-sectional view of the elastic wave filter apparatus according to the first preferred embodiment of the present invention.
Figure 3:
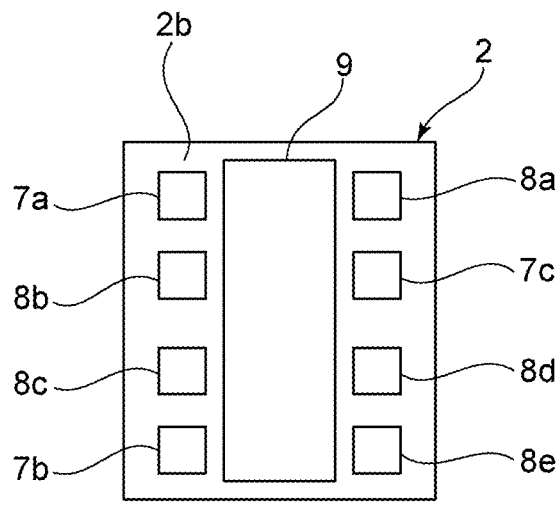
FIG. 3 is a bottom view of the elastic wave filter apparatus according to the first preferred embodiment of the present invention.

FIG. 1 is a partially-notched front cross-sectional view illustrating a structure where an elastic wave filter apparatus according to a first preferred embodiment of the present invention is mounted on a mounting substrate. FIG. 2 is a front cross-sectional view of the elastic wave filter apparatus according to the first preferred embodiment. FIG. 3 is a bottom view of the elastic wave filter apparatus according to the first preferred embodiment.

An elastic wave apparatus 1 according to the present preferred embodiment preferably is a duplexer, for example. As illustrated in FIG. 2, the elastic wave filter apparatus 1 includes a piezoelectric substrate 2 which defines a device substrate. That is, the device substrate is preferably the piezoelectric substrate including one piezoelectric layer in the present preferred embodiment. The piezoelectric substrate 2 is made of an appropriate piezoelectric material, such as piezoelectric single crystal or piezoelectric ceramics. Preferably, LiTaO$_3$ or LiNbO$_3$ may be used as the piezoelectric single crystal.

An IDT electrode 3 and an IDT electrode 4 are provided on the piezoelectric substrate 2. The IDT electrode 3 defines a portion of an elastic wave resonator. The elastic wave resonator is preferably one elastic wave resonator of a transmission filter of the duplexer. The transmission filter includes a plurality of elastic wave resonators.

The IDT electrode 4 is preferably an electrode of a reception filter. The reception filter includes a longitudinally coupled resonator-type elastic wave filter.

In addition to the IDT electrodes 3 and 4, a first electrode land 5a and a second electrode land 6a are provided on a first main surface 2a of the piezoelectric substrate 2. The first electrode land 5a is electrically connected to the IDT electrode 3. The second electrode land 6a is electrically connected to the IDT electrode 4. The first electrode land 5a is an electrode land connected to a signal potential, and the second electrode land 6a is an electrode land connected to a ground potential.

Another second electrode land 6b is provided in an area between the IDT electrode 3 and the IDT electrode 4. The second electrode land 6b is electrically connected to the IDT electrodes 3 and 4.

Signal terminals 7a to 7c and ground terminals 8a to 8e are provided on a second main surface 2b of the piezoelectric substrate 2. The signal terminals 7a to 7c and the ground terminals 8a to 8e are portions connected to the signal potential and the ground potential, respectively, outside the elastic wave filter apparatus 1.

A heat diffusion layer 9 is provided on the second main surface 2b. The heat diffusion layer 9 is made of a material whose thermal conductivity is higher than the piezoelectric material configuring the piezoelectric substrate 2. Metal, or various insulators or semiconductors with higher thermal conductivity than the piezoelectric substrate 2 may be used as such a material. Preferably, the heat diffusion layer 9 is made of metal because it has high thermal conductivity and has electrical conductivity. Examples of such metal include Al, Cu, Ag, Au, Ti, Ni, Sn, Pd, Cr, and NiCr. Alternatively, a plurality of metal films made of such metals may be laminated. A portion of the heat diffusion layer 9 overlaps at least a portion of the IDT electrodes 3 and 4 across the piezoelectric substrate.

The signal terminal 7a faces the first electrode land 5a across the piezoelectric substrate 2. The ground terminal 8a faces the second electrode land 6a across the piezoelectric substrate 2.

At the same time, the second electrode land 6b is located at a position that overlaps the heat diffusion layer 9 across the piezoelectric substrate 2.

A first connection electrode 10 penetrates through the piezoelectric substrate 2. The first connection electrode 10 electrically connects the first electrode land 5a and the signal terminal 7a. Likewise, a second connection electrode 11 penetrates through the piezoelectric substrate 2. The second connection electrode 11 electrically connects the second electrode land 6a and the ground terminal 8a.

Furthermore, another second connection electrode 12 penetrates through the piezoelectric substrate 2. The second connection electrode 12 connects the second electrode land 6b and the heat diffusion layer 9.

The first and second connection electrodes 10 to 12 are made of an appropriate metal or alloy. Preferably, the first and second connection electrodes 10 to 12 and the heat diffusion layer 9 are plated layers formed by plating. That is, the first and second connection electrodes 10 to 12, and the heat diffusion layer 9, which is made of metal, can be easily provided by forming a plating film in through holes provided in the piezoelectric substrate 2 and on the second main surface 2b of the piezoelectric substrate 2. In this case, it is preferable for the signal terminals 7a to 7c and the ground terminals 8a to 8e to be formed by a plating film formed in the same step.

However, the first and second connection electrodes 10 to 12, the heat diffusion layer 9, the signal terminals 7a to 7c, and the ground terminals 8a to 8e may be formed using other methods.

The above-described IDT electrode 3, first electrode land 5a, and second electrode lands 6a and 6b are made of an appropriate metal or alloy.

A supporting layer 13 is provided on the first main surface 2a of the piezoelectric substrate 2. The supporting layer 13 is preferably made of synthetic resin, for example. However, the supporting layer 13 may be made of an insulating material, such as an inorganic insulator, for example. Alternatively, the supporting layer 13 may be made of metal. In that case, the first electrode 5a, which is connected to the signal potential, the IDT electrode 3, and the IDT electrode 4 are not electrically connected to the supporting layer 13. By connecting the supporting layer 13 to the second electrode land 6a connected to the ground potential or to an additionally provided electrode land connected to the ground potential, attenuation characteristics are further improved.

A covering member 14 is stacked so as to cover a cavity provided by the supporting layer 13. Accordingly, the supporting layer 13, the covering member 14, and the first main surface 2a of the piezoelectric substrate 2 define a hollow portion 15 in which the IDT electrodes 3 and 4 are located.

FIGS. 2 and 3 illustrate the signal terminals 7a to 7c, the ground terminals 8a to 8e, and the heat diffusion layer 9, which is made of metal, which are positioned on the second main surface 2b. The signal terminal 7a is a transmission terminal, and the signal terminal 7b is a reception terminal. The signal terminal 7c is a terminal connected to an antenna.

The signal terminal 7c connected to the antenna is located on one of two sides of the heat diffusion layer 9, and the signal terminals 7a and 7b are located on the other side of the heat diffusion layer 9. That is, the heat diffusion layer is located between the signal terminals 7a and 7b, and the signal terminal 7c. In doing so, interference between the signal terminal 7c connected to the antenna and the signal terminals 7a and 7b is able to be reduced or prevented. In addition, the ground terminals 8b and 8c are located between the signal terminal 7a and the signal terminal 7b. As such, isolation between the signal terminal 7a defining and functioning as a transmission terminal and the signal terminal 7b defining and functioning as a reception terminal is improved.

Furthermore, in the elastic wave filter apparatus 1, the heat diffusion layer 9 is electrically connected to the IDT electrodes 3 and 4 with the second connection electrode 12 interposed therebetween. In the elastic wave filter apparatus 1, heat is generated by exciting the IDT electrodes 3 and 4.

This heat is rapidly transmitted to the heat diffusion layer 9 through the electrode land 6b and second connection electrode 12.

In addition, the heat diffusion layer 9 is at a position that overlaps at least a portion of the IDT electrodes 3 and 4 across the piezoelectric substrate 2. Therefore, heat from the IDT electrodes 3 and 4 is diffused through the piezoelectric substrate 2 to the heat diffusion layer 9. This also effectively improves the heat dissipation. In particular, because the thermal conductivity of the heat diffusion layer 9 is higher than the piezoelectric substrate 2, the heat dissipation is effectively increased by providing the heat diffusion layer 9 in an area that overlaps at least a portion of the IDT electrodes 3 and 4.

The area of the heat diffusion layer 9 is greater than that of each of the signal terminals 7a to 7c. As such, the heat dissipation is further effectively increased.

A mounting substrate 16 illustrated in FIG. 1 is preferably made of insulating ceramics or synthetic resin, for example. The mounting substrate 16 includes a first main surface 16a and a second main surface 16b, which face each other. A third electrode land 17a, a fourth electrode land 18a, and a fifth electrode land 19 are provided on the first main surface 16a. The third electrode land 17a and the fourth electrode land 18a are respectively bonded to the signal terminal 7a and the ground terminal 8a with metal bumps 20a and 21a interposed therebetween. The fifth electrode land 19 is electrically connected to the heat diffusion layer 9 with a bonding material 22 interposed therebetween. The third electrode land 17a, the fourth electrode land 18a, and the fifth electrode land 19 are preferably made of appropriate metal or alloy. In contrast, the bonding material 22 is preferably made of metal or alloy, similar to the metal bumps 20a and 21a, in the present preferred embodiment. Therefore, heat is rapidly diffused from the heat diffusion layer 9 through the bonding material 20 toward the fifth electrode land 19 side.

However, it is not necessary for the bonding material 22 to be electrically conductive. It is only necessary for the bonding material 22 to be made of a bonding material with higher thermal conductivity than that of the piezoelectric substrate.

Preferably, the bonding material 22 is made of the same material as that of the metal bumps 20a and 21a. In that case, the bonding material 22 is able to be bonded in the same step.

When the elastic wave filter apparatus 1 is mounted on the mounting substrate 16 from the second main surface 2b side of the piezoelectric substrate 2, heat dissipation is effectively increased. That is, because at least a portion of the IDT electrodes 3 and 4 overlaps the heat diffusion layer 9 across the piezoelectric substrate, and the bonding material 22 is located between the heat diffusion layer 9 and the mounting substrate 16, heat dissipation is effectively increased.

In an elastic wave filter apparatus of the related art, air and sealing resin are present between a piezoelectric substrate and a mounting substrate, resulting in low heat dissipation.

In the present preferred embodiment, heat dissipation is effectively increased due to the heat diffusion layer 9 and the bonding material 22. Therefore, even when a sealing resin layer is added so as to surround the structure illustrated in FIG. 1, heat dissipation is sufficiently increased.

Additionally, attenuation characteristics of the elastic wave filter apparatus are unlikely to deteriorate. This will be described with reference to FIGS. 4 to 6.

As an example of the elastic wave filter apparatus according to the first preferred embodiment, the frequency response of a Band 27 duplexer is obtained as below. Note that the Band 27 duplexer has a transmission band of 807 MHz to 824 MHz and a reception band of 852 MHz to 869 MHz.

A LiTaO$_3$ substrate is used as the piezoelectric substrate 2. A supporting layer is made of polyimide. A covering member is made of polyimide.

The duplexer includes the piezoelectric substrate 2, the supporting layer 13, and a hollow portion surrounded by the covering member.

The IDT electrodes 3 and 4 are made of Al alloy. The signal terminals 7a to 7c, the ground terminals 8a to 8e, and the heat diffusion layer 9 are made of Cu, and preferably have a thickness of about 10 μm, for example.

Note that a transmission filter including the IDT electrode 3 is a ladder filter, and a reception filter including the IDT electrode 4 is a longitudinally coupled resonator-type bandpass filter.

Excluding the fact that no heat diffusion layer 9 is provided, a duplexer according to a comparative example is obtained similarly to the above-described example.

Figure 4:
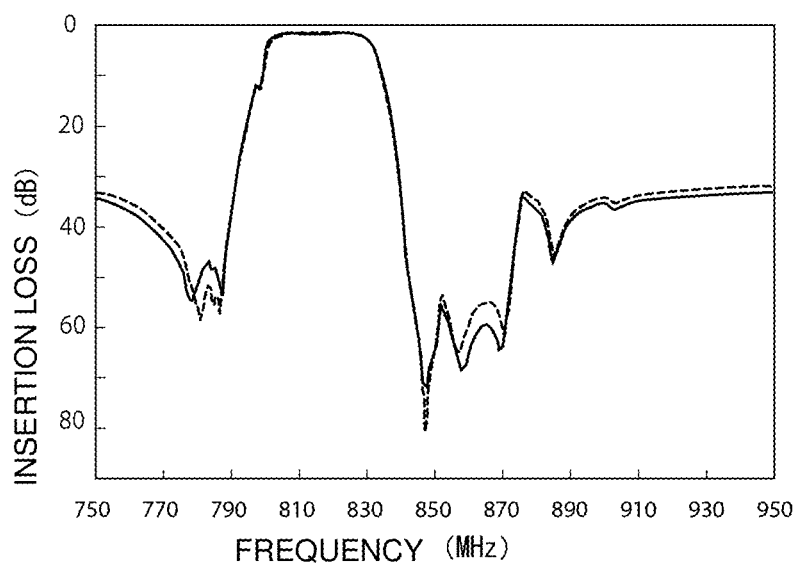
FIG. 4 is a graph illustrating the attenuation amount frequency characteristics of a transmission filter of a duplexer serving as an example of the first preferred embodiment of the present invention, and the attenuation amount frequency characteristics of a transmission filter of a duplexer of a comparative example.
Figure 5:
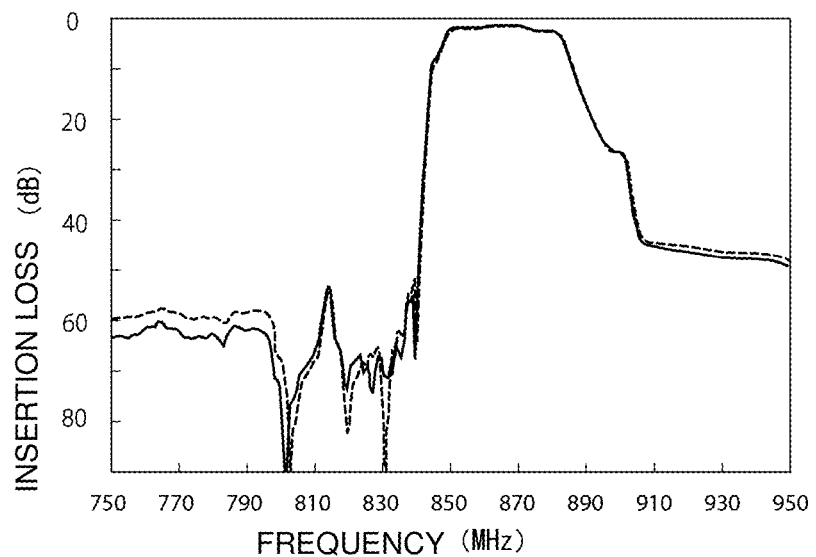
FIG. 5 is a graph illustrating the attenuation amount frequency characteristics of a reception filter of the duplexer serving as an example of the first preferred embodiment of the present invention, and the attenuation amount frequency characteristics of a reception filter of the duplexer of a comparative example.

FIG. 4 illustrates the attenuation amount frequency characteristics of the transmission filter of each of the duplexers according to the example and the comparative example. FIG. 5 illustrates the attenuation amount frequency characteristics of the reception filter of each of the duplexers according to the example and the comparative example.

Figure 6:
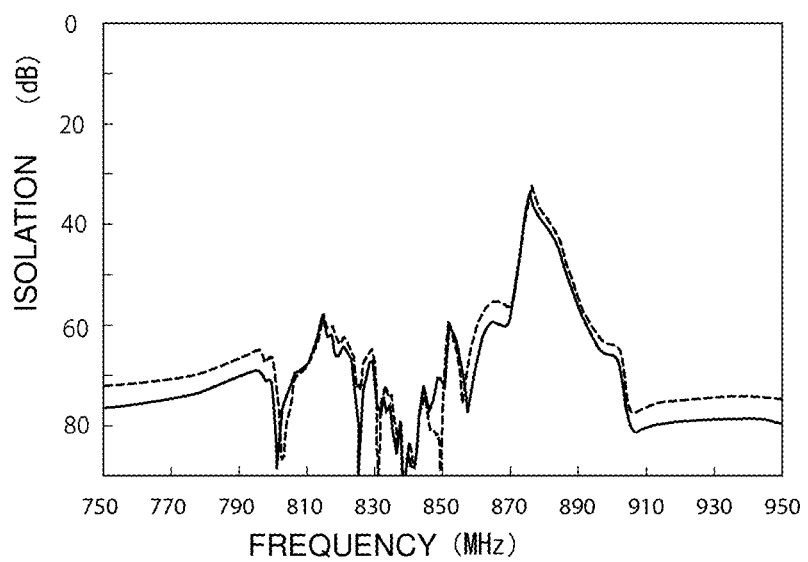
FIG. 6 is a graph illustrating the isolation characteristics of the transmission filter of the duplexer serving as an example of the first preferred embodiment of the present invention, and the isolation characteristics of the transmission filter of the duplexer of a comparative example.

FIG. 6 illustrates the isolation characteristics of the example and the comparative example. In FIGS. 4 to 6, solid lines represent the results of the example, and broken lines represent the results of the comparative example.

As is clear from FIG. 4, comparing the example with the comparative example, the attenuation amount in the reception band is sufficiently increased in the attenuation amount frequency characteristics of the transmission filter. In addition, the attenuation amount is sufficiently increased in a frequency range greater than or equal to about 890 MHz, which is higher than the reception band. Therefore, the out-of-band attenuation amount of the transmission filter is unlikely to deteriorate.

Further, as is clear from FIG. 5, comparing the example with the comparative example, the attenuation amount in the transmission band, and the attenuation amount in a frequency range less than or equal to about 790 MHz, which is lower than the transmission band, are sufficiently increased in the attenuation amount frequency characteristics of the reception filter. In addition, the attenuation amount is sufficiently increased in a frequency range greater than or equal to about 910 MHz. It is thus clear that the attenuation characteristics of the reception filter are unlikely to deteriorate in the example.

Furthermore, as is clear from FIG. 6, the isolation level is increased in the reception band, in a frequency range less than or equal to about 790 MHz, and in a frequency range greater than or equal to about 900 MHz in the isolation characteristics between the transmission filter and the reception filter.

As described above, the out-of-band attenuation characteristics of the duplexer are unlikely to deteriorate. Providing the heat diffusion layer 9 may reduce or prevent the electrical interference between the electrodes of the signal terminals 7a to 7c in addition to causing the increase in heat dissipation as previously described.

Figure 7:
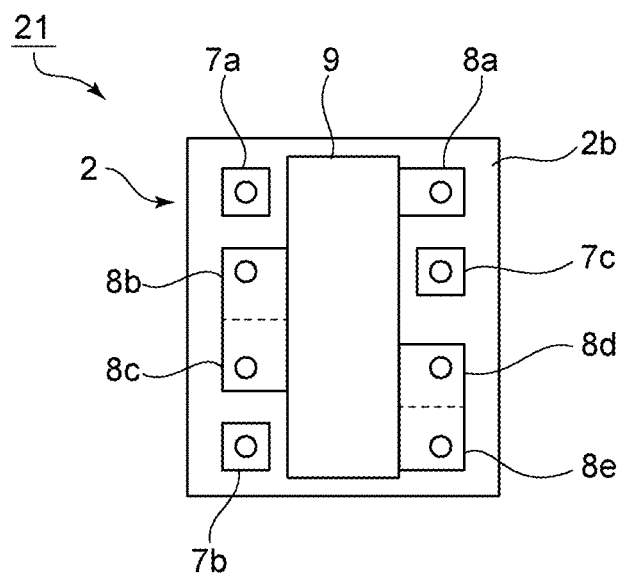
FIG. 7 is a bottom view of an elastic wave filter apparatus according to a second preferred embodiment of the present invention.

FIG. 7 is a bottom view of an elastic wave filter apparatus according to a second preferred embodiment of the present invention. Although the ground terminals 8a to 8e are independent in FIG. 3, the ground terminals 8a to 8e may preferably be connected to the heat diffusion layer 9 connected to the ground potential, as in the second preferred embodiment illustrated in FIG. 7. Also in this case, the isolation is provided between the signal terminal 7a and the signal terminal 7b, between the signal terminal 7b and the signal terminal 7c, and between the signal terminal 7a and the signal terminal 7c by the heat diffusion layer 9 and the ground terminals 8b and 8c connected to the heat diffusion layer 9.

Figure 8:
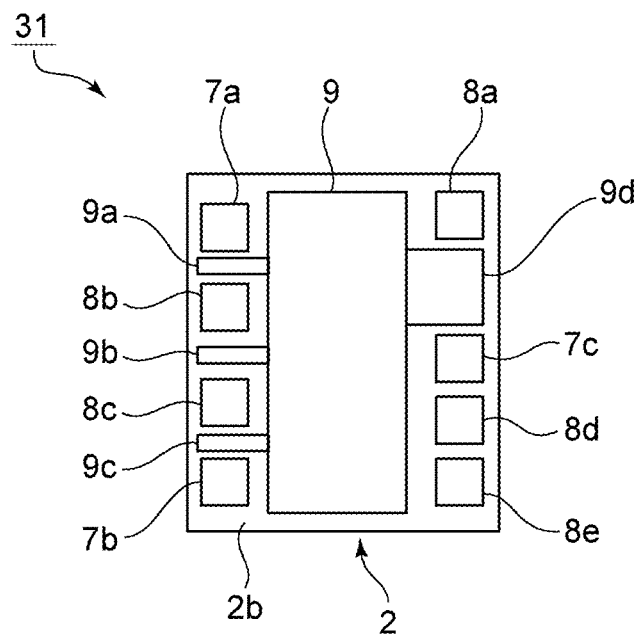
FIG. 8 is a bottom view of an elastic wave filter apparatus according to a third preferred embodiment of the present invention.

FIG. 8 is a bottom view of an elastic wave filter apparatus 31 according to a third preferred embodiment of the present invention. Here, protruding portions 9a to 9c connected to the heat diffusion layer 9 are preferably provided to extend between the signal terminal 7a and the ground terminal 8b, between the ground terminal 8b and the ground terminal 8c, and between the ground terminal 8c and the signal terminal 7b. In addition, a protruding portion 9d is provided between the ground terminal 8a and the signal terminal 7c. The protruding portion 9d is connected to the heat diffusion layer 9.

The elastic wave filter apparatus 31 is preferably configured in the same or similar manner as the elastic wave filter apparatus 1 except for the above points.

Because the heat diffusion layer 9 and the protruding portions 9a to 9d are provided in the elastic wave filter apparatus 31, heat dissipation is increased, and out-of-band attenuation characteristics is prevented from deteriorating. In particular, the heat diffusion layer 9 includes the protruding portions 9a to 9d, and therefore, the area of the diffusion layer 9 is increased. As such, heat dissipation is more effectively increased.

Figure 9:
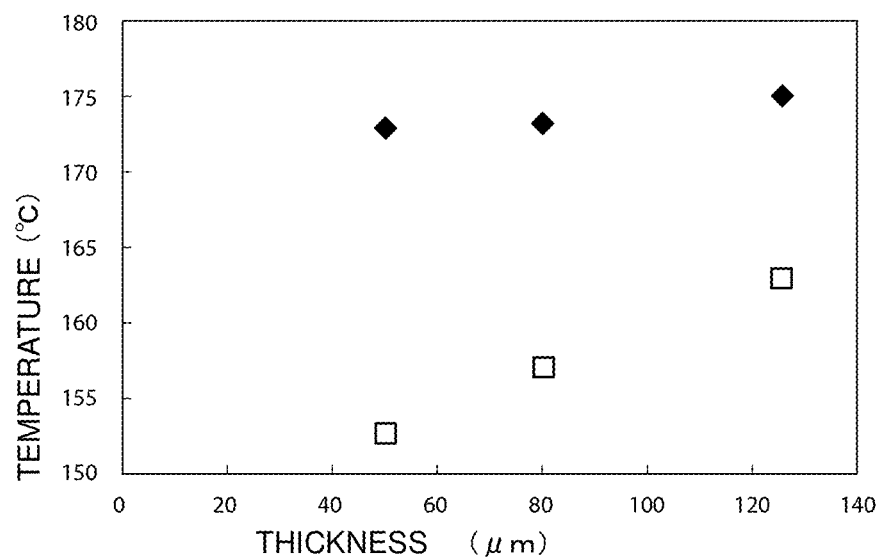
FIG. 9 is a graph illustrating a heat simulation result in the case of changing the thickness of a piezoelectric substrate to about 50 μm, about 80 μm, or about 125 μm in the elastic wave filter apparatus according to the third preferred embodiment of the present invention, and the case of applying electric power to an IDT electrode 3 (a plurality of IDTs of the transmission filter).

FIG. 9 is a graph illustrating a heat simulation result in the case of changing the thickness of the piezoelectric substrate 2 to about 50 μm, about 80 μm, or about 125 μm in the elastic wave filter apparatus 31 according to the third preferred embodiment, and the case of applying electric power to the IDT electrode 3 (a plurality of IDTs defining the transmission filter). In FIG. 9, the temperature of an IDT at the highest temperature is extracted.

In FIG. 9, white squares represent the results of the third preferred embodiment of the present invention, and black diamonds represent the results of a second comparative example. The second comparative example is the same or substantially the same as the third preferred embodiment except for the point that the heat diffusion layer 9 and the protruding portions 9a to 9d are not provided. As is clear from FIG. 9, comparing the third preferred embodiment to the second comparative example, heat dissipation is effectively increased. In particular, it is clear that heat dissipation is sufficiently increased even when the thickness of the piezoelectric substrate is increased.

Figure 10:
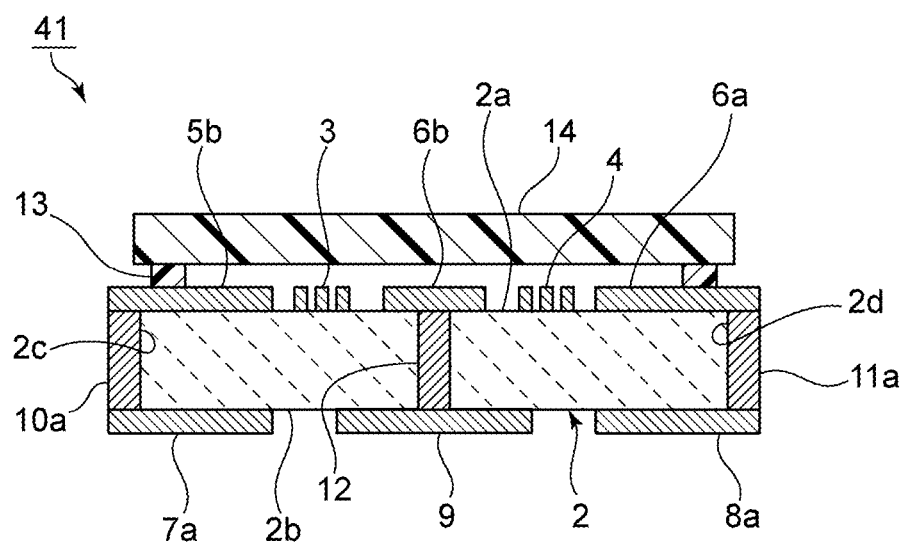
FIG. 10 is a front cross-sectional view of an elastic wave filter apparatus according to a fourth preferred embodiment of the present invention.

FIG. 10 is a front cross-sectional view according to a fourth preferred embodiment of the present invention. In an elastic wave filter apparatus 41, the first and second electrode lands 5b and 6a are extended to edges defined by lateral surfaces 2c and 2d and the first main surface 2a of the piezoelectric substrate 2. The first and second connection electrodes 10a and 11a are provided on the lateral surfaces 2c and 2d. On the second main surface 2b, the signal terminal 7a and the ground terminal 8a are provided to extend to an edge defined by the lateral surface 2c or the lateral surface 2d and the second main surface 2b. As such, the first electrode land 5b and the signal terminal 7a are electrically connected by the first connection electrode 10a. Similarly, the second electrode land 6a and the ground terminal 8a are electrically connected by the second connection electrode 11a. In this manner, as with the first and second connection electrodes 10a and 11a, connection electrodes provided on lateral surfaces of the piezoelectric substrate may preferably be used.

Since the remaining configuration of the elastic wave filter apparatus 41 is the same or substantially the same as the elastic wave filter apparatus 1, descriptions of the same portions are omitted and the same reference numerals are provided for the same or similar elements and portions.

Figure 11:
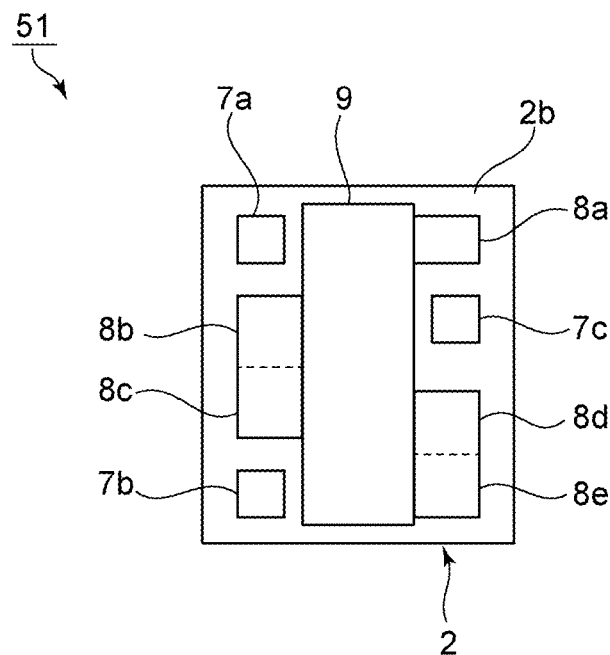
FIG. 11 is a bottom view of an elastic wave filter apparatus according to a fifth preferred embodiment of the present invention.

FIG. 11 is a bottom view of an elastic wave filter apparatus according to a fifth preferred embodiment of the present invention. In an elastic wave filter apparatus 51, the ground terminal 8b and the ground terminal 8c are preferably integrated, as indicated by a broken line, on the second main surface 2b of the piezoelectric substrate 2. Similarly, the ground terminal 8d and the ground terminal 8e are preferably integrated, as indicated by a broken line. The ground terminals 8a to 8e are all connected to the heat diffusion layer 9. In this manner, all of the ground terminals 8a to 8e may be electrically connected to the heat diffusion layer 9.

The elastic wave filter apparatus 51 is the same or substantially the same as the elastic wave filter apparatus 1 according to the first preferred embodiment except for the above-described points.

Figure 12:
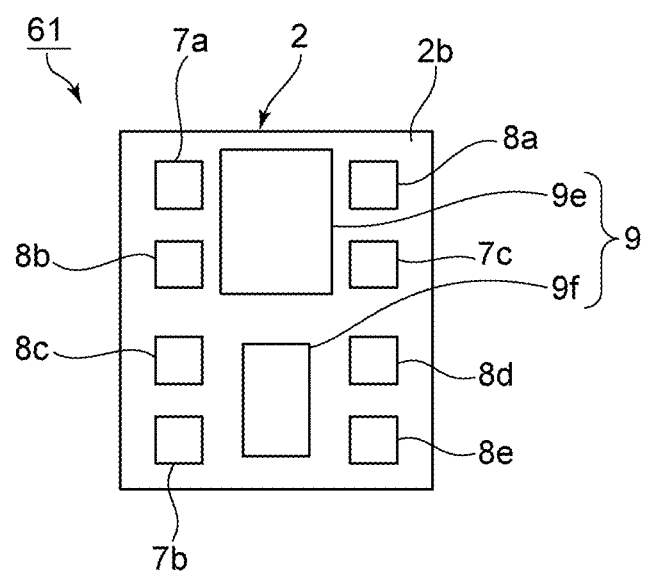
FIG. 12 is a bottom view of an elastic wave filter apparatus according to a sixth preferred embodiment of the present invention.

In an elastic wave filter apparatus 61 according to a sixth preferred embodiment of the present invention illustrated in FIG. 12, the heat diffusion layer 9 is preferably divided into a plurality of heat diffusion layers 9e and 9f. In this manner, the heat diffusion layer 9 may be divided into the plurality of heat diffusion layers 9e and 9f. Also in this case, the heat diffusion layer 9e or the heat diffusion layer 9f is positioned between the signal terminal 7a and the signal terminal 7c and between the signal terminal 7b and the signal terminal 7c. Therefore, the same or similar advantageous effects as those of the first preferred embodiment are achieved.

Figure 13:
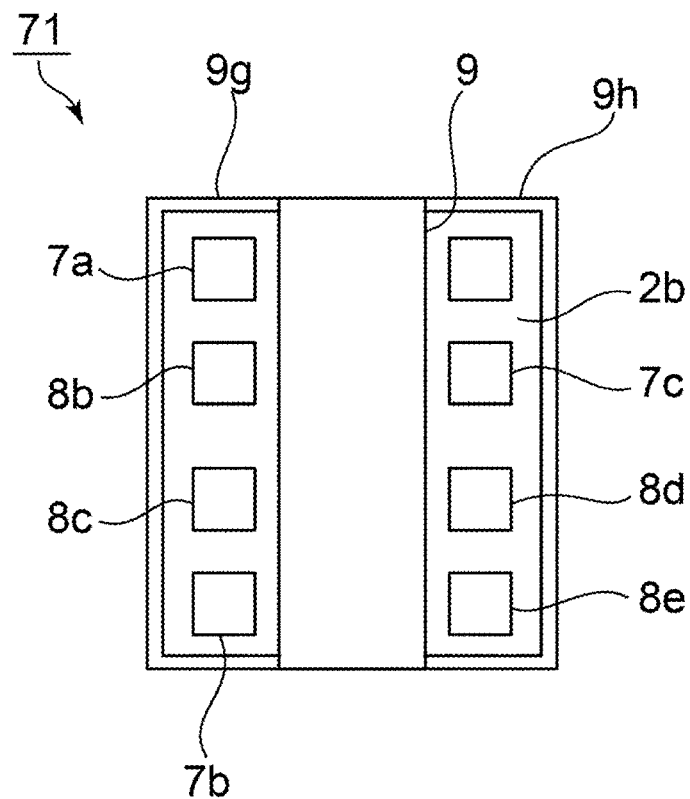
FIG. 13 is a bottom view of an elastic wave filter apparatus according to a seventh preferred embodiment of the present invention.

FIG. 13 is a bottom view of an elastic wave filter apparatus 71 according to a seventh preferred embodiment of the present invention. As in the elastic wave filter apparatus 71, the heat diffusion layer 9 may preferably be provided on the second main surface 2b of the piezoelectric substrate 2 so as to extend from one edge to another edge. Here, frames 9g and 9h extending from one end to another end of the heat diffusion layer 9 and surrounding the outer peripheral of the second main surface 2b are provided to be continuous with the heat diffusion layer 9. The frames 9g and 9h are connected to the heat diffusion layer 9.

Figure 14:
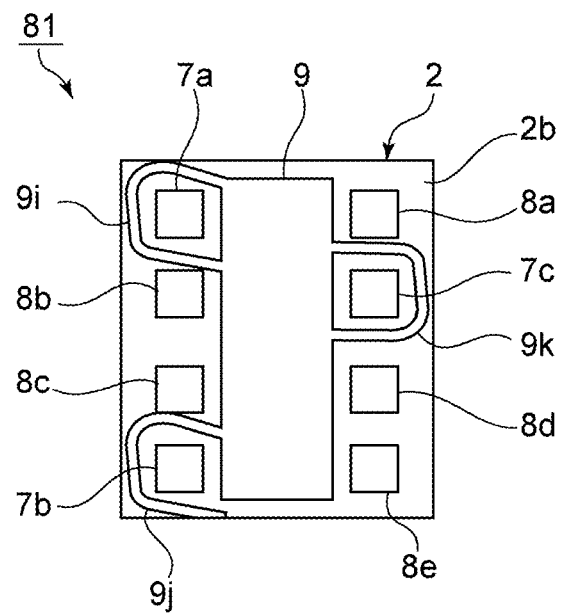
FIG. 14 is a bottom view of an elastic wave filter apparatus according to an eighth preferred embodiment of the present invention.

In an elastic wave filter apparatus 81 according to an eighth preferred embodiment of the present invention illustrated in FIG. 14, loops 9i to 9k that are continuous with the heat diffusion layer 9 and that surround the signal terminals 7a, 7b, and 7c, respectively, are preferably provided. In this manner, when the loops 9i to 9k, connected to the ground potential, surround the signal terminals 7a to 7c, respectively, out-of-band attenuation characteristics is effectively prevented from deteriorating.

Figure 15:
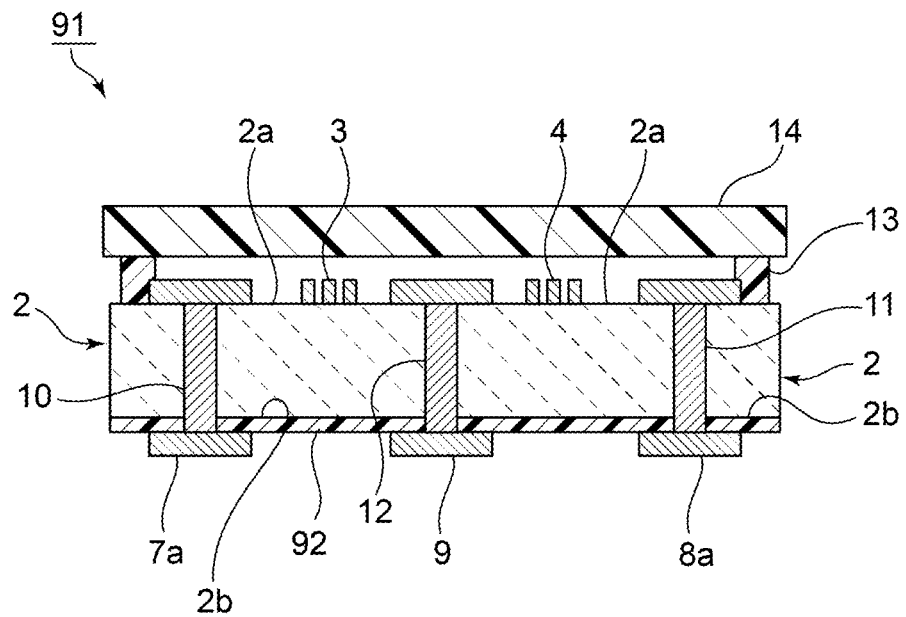
FIG. 15 is a front cross-sectional view of an elastic wave filter apparatus according to a ninth preferred embodiment of the present invention.

FIG. 15 is a front cross-sectional view of an elastic wave filter apparatus 91 according to a ninth preferred embodiment of the present invention. In the elastic wave filter apparatus 91, a resin layer 92 is preferably provided on the second main surface 2b of the piezoelectric substrate 2. The first and second connection electrodes 10 to 12 penetrate the resin layer 92. The signal terminal 7a and the ground terminal 8a are provided on the resin layer 92. The resin layer 92 may preferably be provided in the elastic wave filter apparatus 91. In doing so, moisture resistance is increased.

Figure 16:
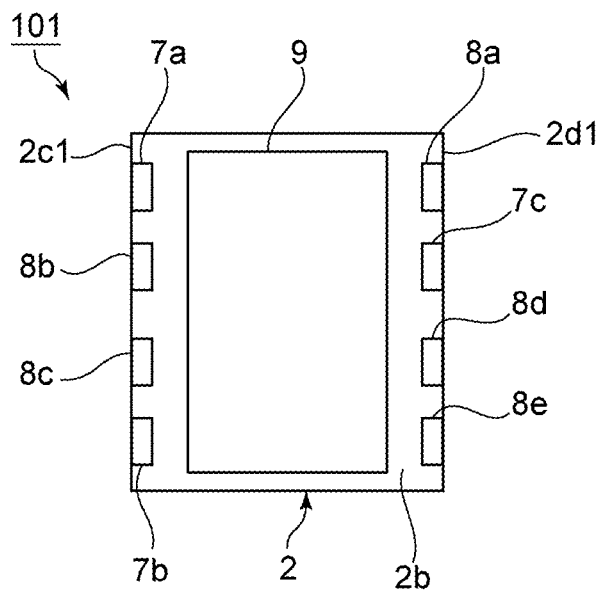
FIG. 16 is a bottom view of an elastic wave filter apparatus according to a tenth preferred embodiment of the present invention.

FIG. 16 is a bottom view of an elastic wave filter apparatus 101 according to a tenth preferred embodiment of the present invention. In the elastic wave filter apparatus 101, the signal terminals 7a to 7c and the ground terminals 8a to 8e are preferably provided on the second main surface 2b so as to be provided along with an edge 2c1 or an edge 2d1 defined by a lateral surface and the second main surface 2b of the piezoelectric substrate 2. In the elastic wave filter apparatus 101, the signal terminals 7a to 7c and the ground terminals 8a to 8e preferably have a rectangular or substantially rectangular planar shape, for example.

Figure 17:
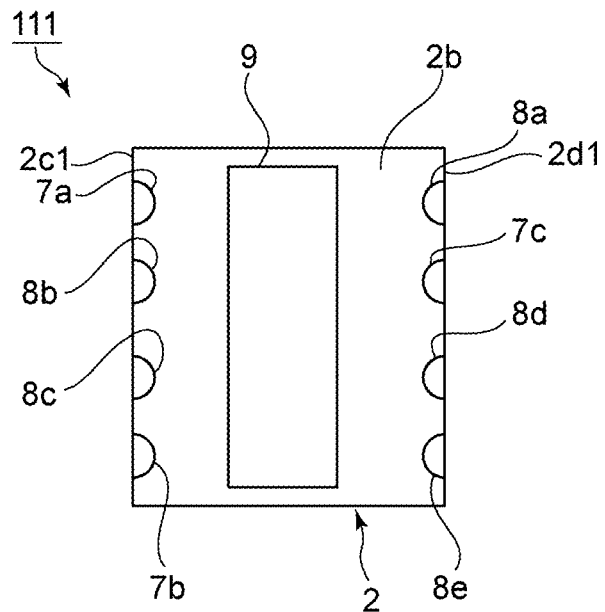
FIG. 17 is a bottom view of an elastic wave filter apparatus according to an eleventh preferred embodiment of the present invention.

Similarly, in an elastic wave filter apparatus 111 according to an eleventh preferred embodiment of the present invention illustrated in FIG. 17, the signal terminals 7a to 7c and the ground terminals 8a to 8e are preferably provided along the edge 2c1 or the edge 2d1. In the elastic wave filter apparatus 111, the signal terminals 7a to 7c and the ground terminals 8a to 8e preferably have a semicircular or substantially semicircular planar shape, for example. As described above, the planar shape and location of each signal terminal and ground terminal are not particularly limited.

As in the above-described elastic wave filter apparatuses 101 and 111, when the signal terminals 7a to 7c and the ground terminals 8a to 8e are provided along the edge 2c1 or the edge 2d1, connection electrodes provided on the lateral surface 2c or the lateral surface 2d are able to be suitably used as the first and second connection electrodes.

Figure 18:
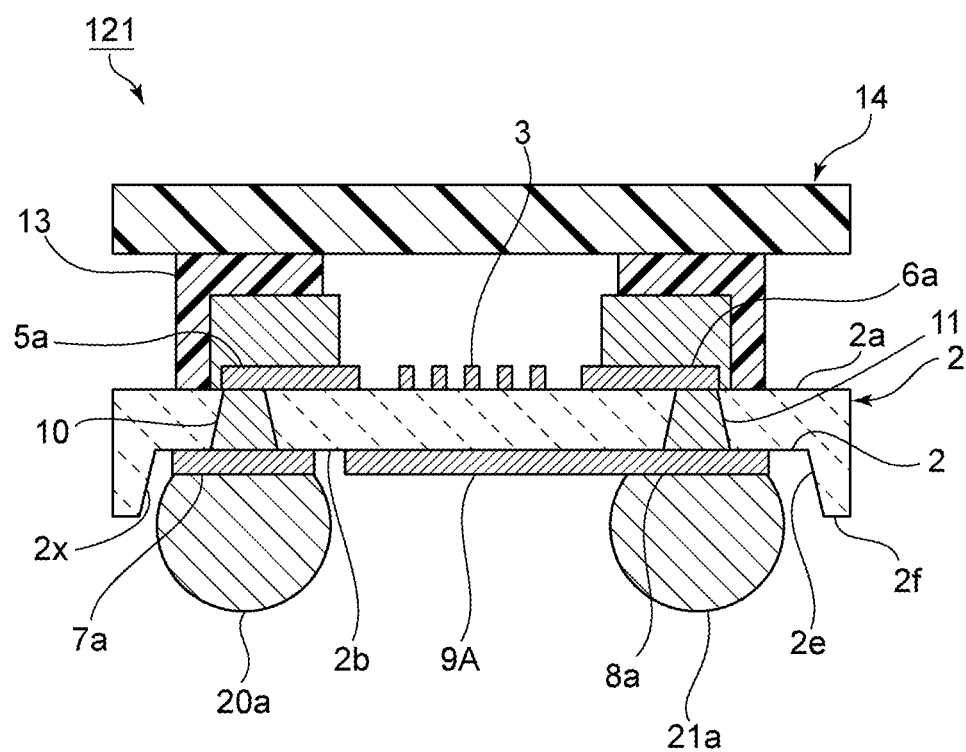
FIG. 18 is a front cross-sectional view of an elastic wave filter apparatus according to a twelfth preferred embodiment of the present invention.

FIG. 18 is a front cross-sectional view of an elastic wave filter apparatus according to a twelfth preferred embodiment of the present invention. In an elastic wave filter apparatus 121, a concave portion 2x is preferably provided on the second main surface 2b of the piezoelectric substrate 2. The second main surface 2b includes a bottom surface of the concave portion 2x, side walls 2e, and frame portions 2f.

The signal terminal 7a and the ground terminal 8a are provided on the bottom surface of the concave portion 2x of the second main surface 2b. Here, a heat diffusion layer 9A is preferably provided to be continuous with the ground terminal 8a. The metal bump 20a is provided on the signal terminal 7a, and the metal bump 21a is provided on the ground terminal 8a. The metal bumps 20a and 21a protrude to the outside beyond the concave portion 2x. Therefore, the elastic wave filter apparatus 121 is able to be bonded to the electrode lands on the mounting substrate using the metal bumps 20a and 21a.

In the elastic wave filter apparatus 121, the heat diffusion layer 9A is preferably positioned in a portion that overlaps the IDT electrode 3 across the piezoelectric substrate 2. The thickness of the piezoelectric substrate 2 is thinner by an amount corresponding to the concave portion 2x, in the portion where the heat diffusion layer 9A is provided. Therefore, heat generated at the IDT electrode 3 is not only dissipated through the second electrode land 6a and the second connection electrode 11, but also is able to be rapidly dissipated through the interior of the piezoelectric substrate 2 to the heat diffusion layer 9A facing the IDT electrode 3 across the piezoelectric substrate 2. Therefore, heat dissipation is effectively increased.

In the elastic wave filter apparatus 121, because the thickness of the piezoelectric substrate 2 is reduced by providing the concave portion 2x, it becomes easier to form via holes for the first connection electrode 10 and the second connection electrode 11.

Although not illustrated in FIG. 18, a third electrode land electrically connected to the IDT electrode 3 may preferably be electrically connected to the heat diffusion layer 9A in an unillustrated portion.

The concave portion 2x may be filled with synthetic resin to eliminate an elevation difference with the frame portions 2f of the piezoelectric substrate 2.

Figure 19:
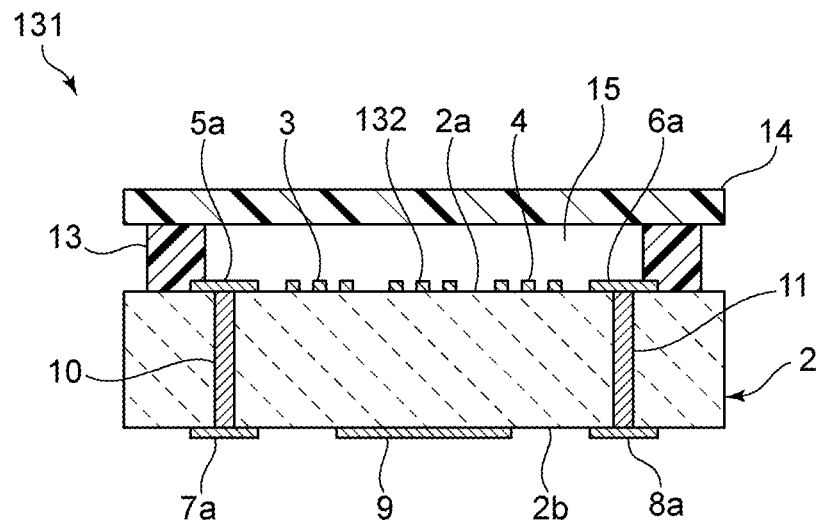
FIG. 19 is a front cross-sectional view of an elastic wave filter apparatus according to a thirteenth preferred embodiment of the present invention.

FIG. 19 is a front cross-sectional view of an elastic wave filter apparatus according to a thirteenth preferred embodiment of the present invention. In an elastic wave filter apparatus 131, the second connection electrode 12 illustrated in FIG. 2 is preferably not provided. Also, the second electrode land 6b illustrated in FIG. 2 is preferably not provided. Instead, an IDT electrode 132 is provided at a position at which the second electrode land 6b is provided. In the present preferred embodiment, the heat diffusion layer 9 is not connected to the second electrode land. Also in this case, because the heat diffusion layer 9 faces the IDT electrode 132 across the piezoelectric substrate 2, heat generated at the IDT electrodes 3, 4, and 132 propagates through the piezoelectric substrate 2 and is rapidly transmitted to the heat diffusion layer 9. The other structure of the elastic wave filter apparatus 131 is preferably the same or substantially the same as the elastic wave filter apparatus 1.

Also in the elastic wave filter apparatus 131, the heat diffusion layer 9 is provided on the second main surface 2b of the piezoelectric substrate 2. The heat diffusion layer 9 is bonded to the third electrode land 19 illustrated in FIG. 1 with the bonding material 22 interposed therebetween when the elastic wave filter apparatus 131 is mounted on the mounting substrate 16 illustrated in FIG. 1. Therefore, similarly to the elastic wave filter apparatus 1, the heat diffusion layer 9 is electrically connected to the third electrode land 19 connected to the ground potential. Therefore, electrical coupling between the signal terminal 7a and the ground terminal 8a is effectively reduced or prevented. In doing so, attenuation characteristics are improved. Additionally, because the heat diffusion layer 9 is provided, heat generated at the IDT electrodes 3, 4, and 132 is rapidly transmitted through the piezoelectric substrate 2 to the heat diffusion layer 9. Therefore, heat diffusion is also increased.

Because the second electrode land 6b is unnecessary in the elastic wave filter apparatus 131, an area in which the IDT electrodes are located is able to be increased. This increases the degree of design freedom.

Figure 20:
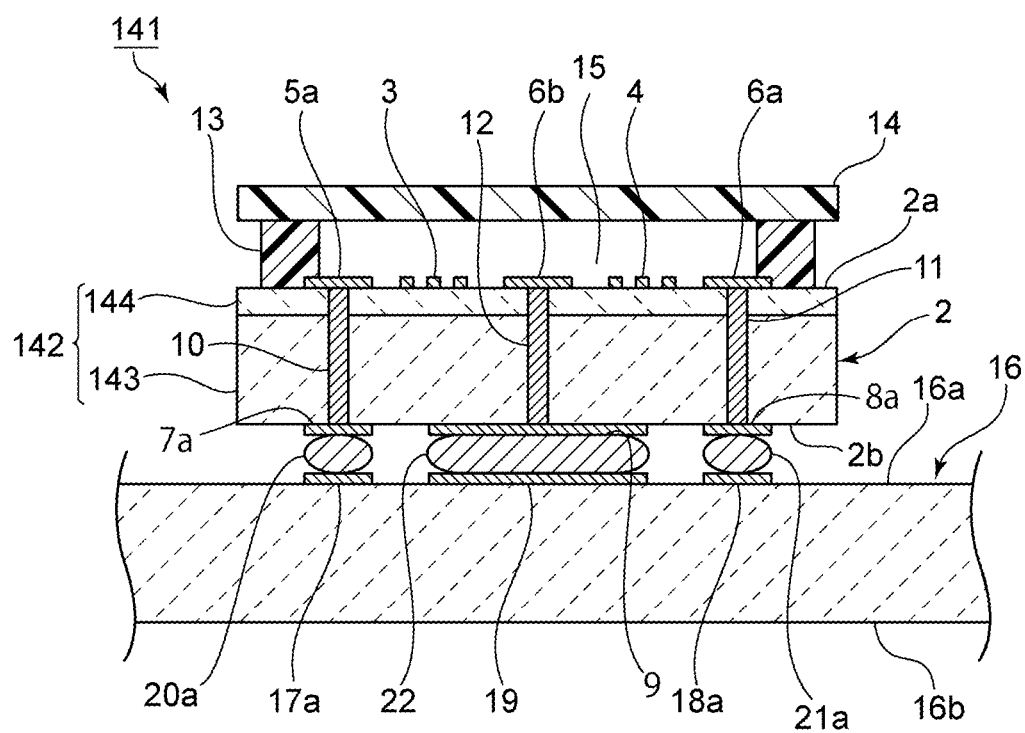
FIG. 20 is a partially-notched front cross-sectional view illustrating a portion where an elastic wave filter apparatus according to a fourteenth preferred embodiment of the present invention is mounted on a mounting substrate.

FIG. 20 is a partially-notched front cross-sectional view illustrating a portion where an elastic wave filter apparatus 141 according to a fourteenth preferred embodiment of the present invention is mounted on a mounting substrate. In the elastic wave filter apparatus 141, a device substrate 142 includes a supporting substrate 143 and a piezoelectric layer 144 provided on the supporting substrate 143. The piezoelectric layer 144 is positioned on a first main surface side of the device substrate 142. The piezoelectric layer 144 is preferably made of piezoelectric single crystal, such as $LiTaO_3$ or $LiNbO_3$, or piezoelectric ceramics, for example. The supporting substrate 143 is preferably made of Si in the present preferred embodiment. However, the material used for the supporting substrate 143 is not limited to Si. As such a material, an appropriate material through which a bulk wave propagates at a higher acoustic velocity than an elastic wave that propagates through the piezoelectric layer 144, or a material whose thermal conductivity is higher than that of the piezoelectric layer 144 is preferably used. Such a material includes sapphire, in addition to Si.

Since the remaining configuration of the elastic wave filter apparatus 141 is the same or substantially the same as the elastic wave filter apparatus 1, descriptions of the same portions are omitted the same reference numerals are provided for the same or similar elements and portions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter apparatus comprising:
a device substrate including a piezoelectric layer, the device substrate including a first main surface and a second main surface that face each other;
at least two excitation electrodes provided on the first main surface of the device substrate, the at least two excitation electrodes defining an elastic wave filter device;
a first electrode land provided on the first main surface of the device substrate and connected to one of the at least two excitation electrodes, the first electrode land being connected to a signal potential;
a plurality of second electrode lands provided on the first main surface of the device substrate, the plurality of second electrode lands being electrically connected to a ground potential, at least one of the plurality of second electrode lands electrically connected to the at least two excitation electrodes, and the at least one of the plurality of second electrode lands is provided in an area between the at least two excitation electrodes;
a signal terminal and a plurality of metal members provided on the second main surface of the device substrate, the signal terminal being connected to the signal potential, the plurality of metal members being connected to the ground potential;
a first connection electrode that connects the first electrode land and the signal terminal;
a second connection electrode that electrically connects the at least one of the plurality of second electrode lands and at least one of the plurality of metal members; wherein
the at least one of the plurality of metal members is electrically connected to the at least two excitation electrodes through the second connection electrode and the at least one of the plurality of second electrode lands, and the at least one of the plurality of metal members overlaps at least a portion of each of the at least two excitation electrodes across the device substrate.

2. The elastic wave filter apparatus according to claim 1, further comprising:
a supporting layer provided on the first main surface of the device substrate;
a cover provided on the supporting layer; wherein
the supporting layer, the cover, and the first main surface of the device substrate define a hollow portion in which the at least two excitation electrodes are located.

3. The elastic wave filter apparatus according to claim 1, wherein at least one of the plurality of metal members is a ground terminal.

4. The elastic wave filter apparatus according to claim 1, wherein an area of at least one of the plurality of metal members is greater than an area of the signal terminal.

5. The elastic wave filter apparatus according to claim 1, wherein the first and second connection electrodes penetrate through the device substrate.

6. The elastic wave filter apparatus according to claim 1, wherein the device substrate includes a lateral surface connecting the first main surface and the second main surface, and the first and second connection electrodes are provided on the lateral surface.

7. The elastic wave filter apparatus according to claim 1, wherein the first and second connection electrodes and at least one of the plurality of metal members include a plating film.

8. The elastic wave filter apparatus according to claim 1, wherein the signal terminal includes a plurality of signal terminals provided on the second main surface of the device substrate, at least one of the plurality of signal terminals is located on one of two sides of the at least one of the plurality of metal members connected to the second connection electrode, and at least another one of the plurality of signal terminals is located on the other side of the at least one of the plurality of metal members connected to the second connection electrode.

9. The elastic wave filter apparatus according to claim 8, wherein the plurality of signal terminals have a rectangular or substantially rectangular planar shape.

10. The elastic wave filter apparatus according to claim 8, wherein the plurality of signal terminals have a semicircular or substantially semicircular planar shape.

11. The elastic wave filter apparatus according to claim 8, wherein each of the plurality of signal terminals extends along one of opposed edges of the device substrate.

12. The elastic wave filter apparatus according to claim 1, wherein the device substrate is a piezoelectric substrate including the piezoelectric layer.

13. The elastic wave filter apparatus according to claim 1, wherein the device substrate includes a supporting substrate and the piezoelectric layer is provided on the supporting substrate.

14. The elastic wave filter apparatus according to claim 1, wherein at least one of the plurality of metal members is located on one of two sides of the at least one of the plurality of metal members connected to the second connection electrode, and at least another one of the plurality of metal members is located on the other side of the at least one of the plurality of metal members connected to the second connection electrode.

15. The elastic wave filter apparatus according to claim 14, wherein the plurality of metal members have a rectangular or substantially rectangular planar shape.

16. The elastic wave filter apparatus according to claim 14, wherein the plurality of metal members have a semicircular or substantially semicircular planar shape.

17. The elastic wave filter apparatus according to claim 14, wherein each of the plurality of metal members extends along one of opposed edges of the device substrate.

* * * * *